(12) United States Patent
Lee et al.

(10) Patent No.: US 7,102,890 B2
(45) Date of Patent: Sep. 5, 2006

(54) HEAT SINK RETENTION DEVICE

(75) Inventors: Hsieh-Kun Lee, Tu-Cheng (TW);
Dong-Yun Li, Shenzhen (CN);
Hong-Bo Shi, Shenzhen (CN); Min Li,
Shenzhen (CN)

(73) Assignee: Hon Hai Precision Industry Co., Ltd.,
(TW)

( * ) Notice: Subject to any disclaimer, the term of this patent is extended or adjusted under 35 U.S.C. 154(b) by 82 days.

(21) Appl. No.: 10/990,078

(22) Filed: Nov. 16, 2004

(65) Prior Publication Data

US 2005/0141202 A1    Jun. 30, 2005

(30) Foreign Application Priority Data

Dec. 26, 2003    (CN) ................................ 92 2 22758

(51) Int. Cl.
*H05K 7/20* (2006.01)

(52) U.S. Cl. ...................... 361/704; 361/707; 361/710; 361/719; 165/80.3; 165/185; 257/719; 248/510

(58) Field of Classification Search ................ 361/704, 361/707, 709–714, 719, 720–724; 257/718–719, 257/726–727; 165/80.3, 80.4, 185; 24/457–458, 24/294–297, 625; 248/505, 510; 174/16.3, 174/52.4, 252, 254, 260; 29/739, 740, 845

See application file for complete search history.

(56) References Cited

U.S. PATENT DOCUMENTS

| 5,332,306 | A | | 7/1994 | Babb et al. |
|---|---|---|---|---|
| 6,055,159 | A | * | 4/2000 | Sun ............................. 361/704 |
| 6,734,371 | B1 | * | 5/2004 | Arrigotti et al. ............ 174/260 |
| 6,860,321 | B1 | * | 3/2005 | Ji-Hai et al. ................ 165/80.3 |
| 6,924,984 | B1 | * | 8/2005 | Lee et al. .................... 361/704 |

FOREIGN PATENT DOCUMENTS

TW          435933          5/2001

* cited by examiner

*Primary Examiner*—Michael Datskovskiy
(74) *Attorney, Agent, or Firm*—Morris Manning & Martin; Tim Tingkang Xia, Esq.

(57) ABSTRACT

The retention device comprises a clip and a back plate engaging the clip, the clip comprises pressing members for press the heat sink onto the processor and at least a pair of hooks, the back plate is placed below a printed circuit board on which the processor is mounted, and comprises a body and at least a pair of retaining rings mounted thereof. The retaining rings travel through mounting holes in the printed circuit board and beyond the top surface thereof for catching the hooks of the clip.

14 Claims, 5 Drawing Sheets

HEAT SINK RETENTION DEVICE

BACKGROUND OF THE INVENTION

1. Field of the Invention

The present invention relates generally to a retention device, and particularly to a heat sink retention device including a back plate.

2. Related Art

Historically, when microprocessors were first commercialized, each microprocessor held less than one million transistors, and operated at speeds below 20 MHz. Typically, the microprocessors were either directly mounted to a printed circuit board by soldering or mounted to the printed circuit board via sockets.

With the continuing and rapid development of integrated circuits technology, the number of transistors contained in each microprocessor, as well as the processor operating speed, has increased dramatically. Correspondingly, the amount of heat that needs to be dissipated has increased. As a result, today's microprocessors used in computer systems almost employ heat sinks with fans to ensure that microprocessors run within their normal operating temperature ranges. At the same time, the trend to increase transistor density and operating speed is expected to continue. It is expected that because of increase of the amount of heat that needs to be dissipated, contact between the processor package and a heat sink will reach a point of critical importance. That is, the physical contact between the processor package and the heat sink plays a critical role in heat dissipation.

Heat dissipation efficiency of a heat sink has been increased by using a clip which physically holds the heat sink to firmly contact with the processor package. One such clip is a socket attach clip. To adequately dissipate heat from a processor containing large scale integrated circuits, a heat sink is required to have enough surface area. This results in an increased mass for the heat sink. Generally, the size of a socket is generally changeless, reliably retaining such an increscent large heat sink to the socket is difficult because of imparity of size between the heat sink and the socket. In order to mounting a large heat sink to a processor, a conventional method employs a spring clip with hooks to travel through mounting holes formed in the printed circuit board. The spring clip secures the heat sink to the processor after the hooks travel through the mounting holes to clasp the bottom face of the printed circuit board. An apparent disadvantage of this method is unsteadiness of mounting. The hooks are prone to jump out of the mounting holes due to mechanical shock or vibration during the operation of the processor, which results in the heat sink's departing from the processor and consequently the temperature of the processor's dramatically increasing. Another deflect also should not be ignored that the printed circuit board is prone to be damaged because of direct contacting force exerted by the spring clip, especially during mounting and removing the heat sink.

To overcome the above-mentioned deflect, an improved approach in which a plurality of rings is soldered to a circuit board has been developed. A clip with hooks for securing a heat sink clasps the rings instead of directly contacting the printed circuit board. However, it is required to affix extra structure to the printed circuit board. Furthermore, there is a requirement of adopting a solid metal material where the ring is soldered. On the other hand, a retention force between the heat sink and the printed circuit board could indirectly result in deformation of the printed circuit board as the increase of retention force for securing the heat sink along with the increase of volume of the heat sink.

At present, a prevalent approach, shown in FIG. 5, employs a back plate 100 which locates below a printed circuit board 200. A plurality of pillar 120 extends from the back plate 100 to pass through holes defined in the printed circuit board 200. A screw eye 121 is defined in the end of each pillar 120. Screws 400 corresponding to the pillars 120 travel through holes defined in a heat sink 300 to engage into the screw eyes 121 to thereby fasten the heat sink 300 onto a processor 220. The use of the back plate 100 avoids exerting a direct force on the printed circuit board and affixing extra construre to the printed circuit board. However, as any one skilled in the art has known, mounting a heat sink using screws is inconvenient, and making screw eyes in the pillars is not an efficient fabrication. A more dramatic disadvantage is that it is difficult to ensure the joining forces between the screws and the pillars in different place balance. Unbalanced joining forces will result in deformation of the printed circuit board and bad contact between the heat sink and the processor.

For the reasons stated above, and for other reasons stated below which will become apparent to those skilled in the art upon reading and understanding the present specification, there is a need in the art for improved heat sink retention device.

SUMMARY OF THE INVENTION

It is an object of the present invention to overcome the above-mentioned problem so as to provide a heat sink retention device easy to fabricate and operate.

It is another object of the present invention to provide a heat sink retention device which mounts the heat sink with balanced contacting forces to a processor.

To achieve the above-mentioned objects, the heat sink retention device in accordance with a preferred embodiment of the present invention comprises a clip and a back plate engaged with the clip. The clip comprises pressing member for pressing a heat sink to the processor and at least a pair of hooks. The back plate is placed below a printed circuit board on which the processor is mounted, and comprises a body and at least a pair of retaining rings mounted thereof. The retaining rings travel through mounting holes defined in the printed circuit board and beyond the top surface thereof for catching the hooks of the clip.

BRIEF DESCRIPTION OF THE DRAWINGS

Other objects, advantages and novel features of the present invention will be drawn from the following detailed description of the preferred embodiment of the present invention with attached drawings, in which.

DETAILED DESCRIPTION OF THE INVENTION

In the following detailed description of the invention, reference is made to the accompanying drawings which form a part thereof, and in which is shown, by way of illustration, specific embodiments in which the invention may practiced. The embodiment is described in sufficient detail to enable those skilled in the art to practice the invention. Other embodiments may be utilized and structural, logical changes may be made without departing from the spirit of the present invention.

Figure 1:
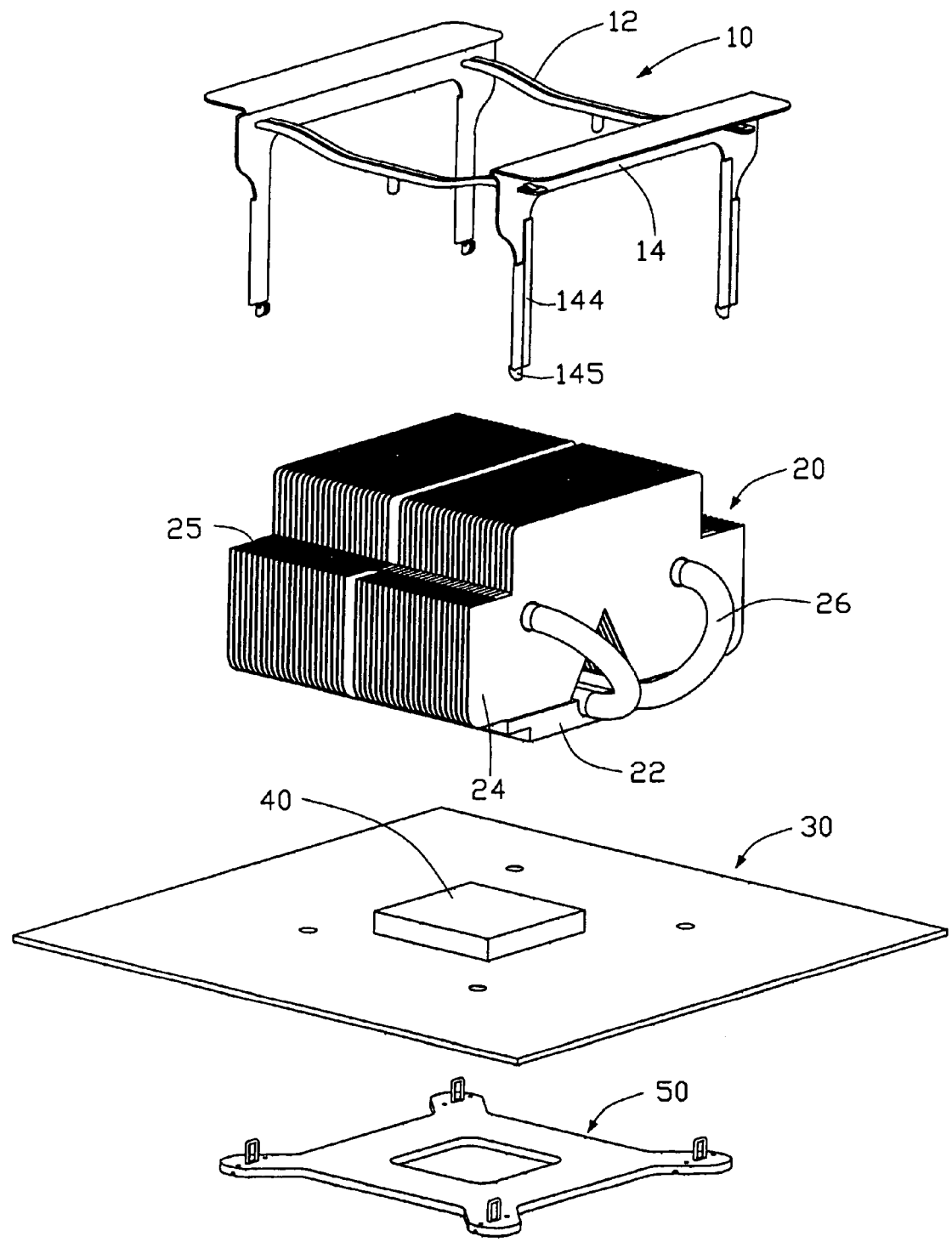
FIG. 1 is an exploded, respective view of the heat sink retention device accompanying with related components in accordance with the present invention.

Referring to FIG. 1, a heat sink retention device, accompanying with a heat sink 20 and a printed circuit board 30 on which a processor 40 is mounted, in accordance with the present invention is illustrated. The retention device comprises a clip 10 for securing the heat sink 20 and a back plate 50 engaged with the clip 10.

The heat sink 20 comprises a metal base 22 for contacting with and absorbing heat from the processor 40, a plurality of fins 24 disposed on the base 22 and several heat pipes 26 which thermally connects the base 22 with the fins 24. Two opposite sides of the top portion of the heat sink 20 are partially cut off to form two platforms 25 for supporting the clip 10 thereon. It is obvious that the structure of the heat sink 20 is not limited to the above specific design.

The clip 10 comprises two elongated resilient pressing members 12 for pressing the heat sink 20 on the processor 40 and two pairs of inverted U-shaped arms 14 coupled to the pressing members 12. Each arm 14 has a pair of hooks 145 formed at two free ends thereof.

Figure 2:
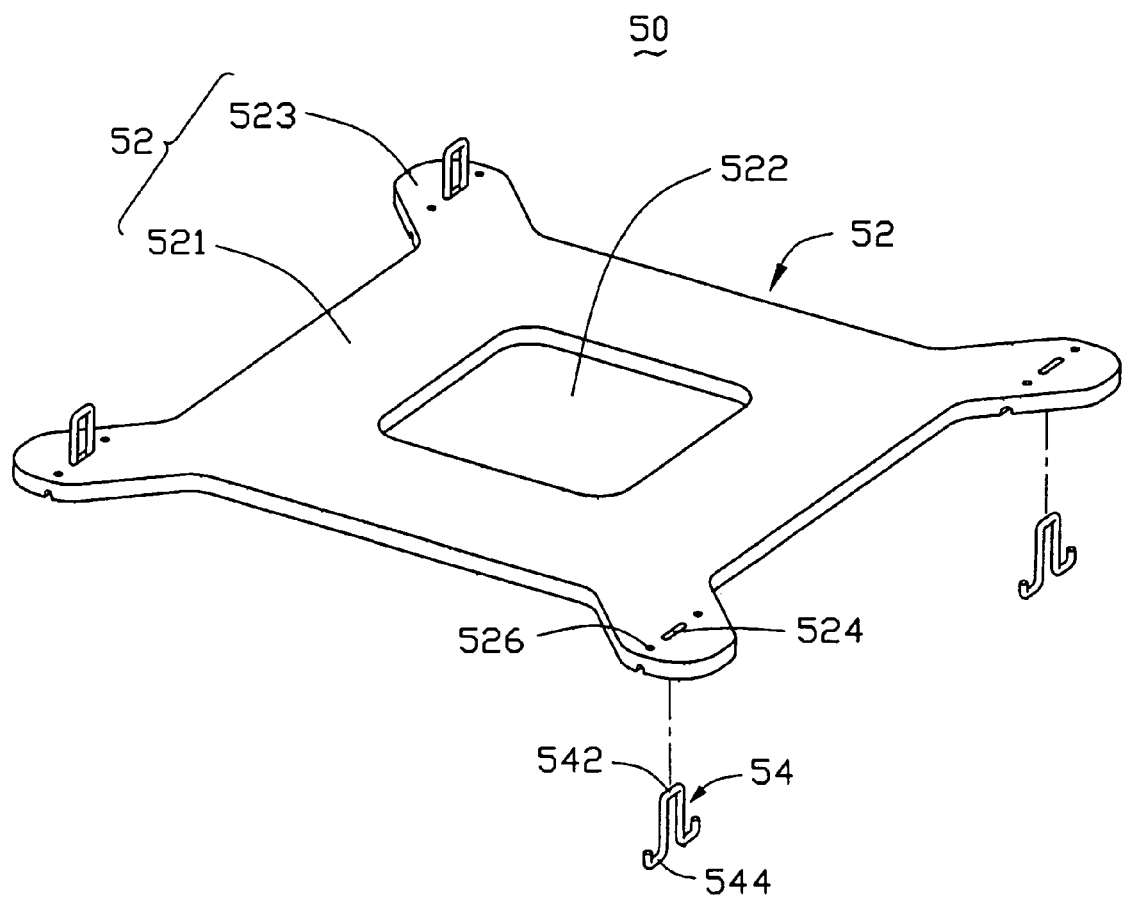
FIG. 2 is an exploded in part respective view of the back plate of FIG. 1.
Figure 3:
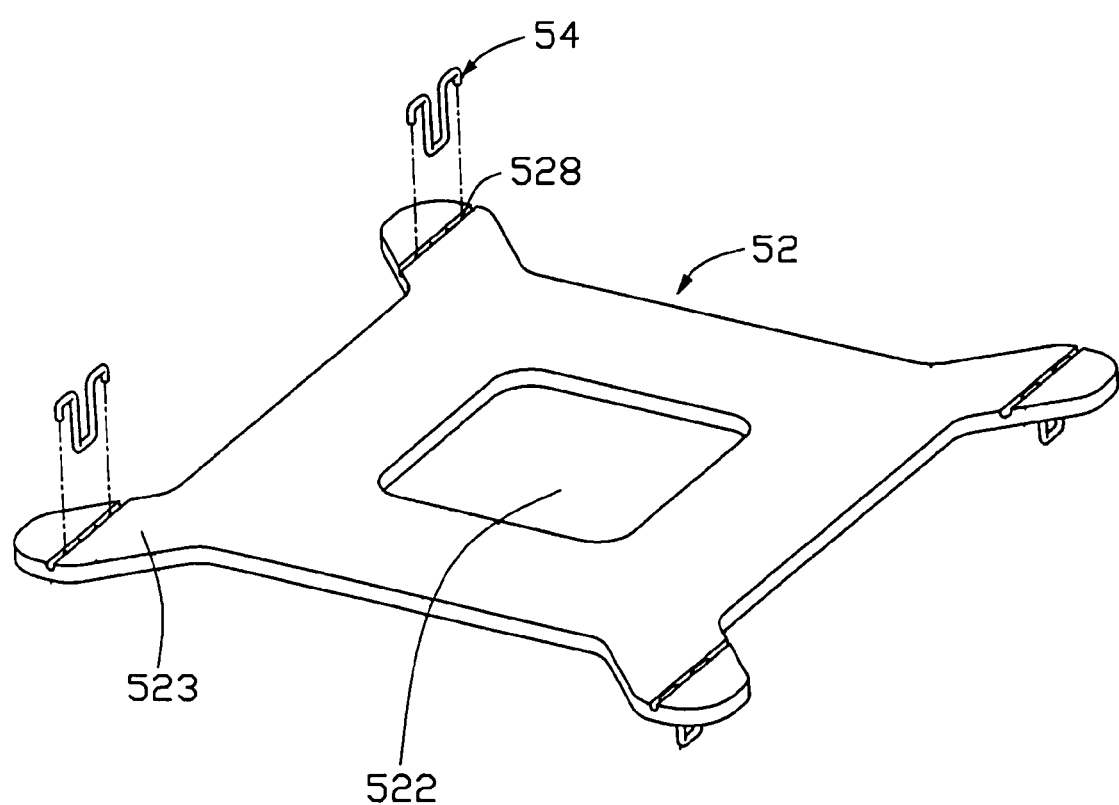
FIG. 3 is similar to FIG. 2 but shown inverted.

Referring to FIG. 2 and FIG. 3, the back plate 50 comprises a substantially cross-shaped flat body 52 and two pairs of ring-shaped retaining members 54 mounted on the body 52. The body 52 comprises a rectangular central portion 521 and two pair of ears 523. A rectangular opening 522 is defined in the central portion 521, for improving elastic deformability of the body 52 and decreasing the weight of the body 52. The ears 523 extend radially and outwardly from four corners of the central portion 521. Two pairs of elongated slots 524 parallel to each other are respectively defined in the ears 523 and pass through the ears 523. A couple of retaining holes 526 is defined in each ear 523 at opposite sides of and aligned with the corresponding slot 524. A linear groove 528 aligned with the slot 524 is defined in the bottom face of each ear 523. Each of the retaining rings 54 is formed by bending a metal wire and comprises an inverted U-shaped retainer 542, which travels through the slot 524 of the ear 523 upwardly and beyond the top surface of the body 52, and a pair of claws 544 extending outward from the free ends of the retainer 542. The claws 544 of each retaining ring 54 are received in the groove 528 of the ear 523 and the two free ends of each claw 544 are inserted tightly into the retaining holes 526 of the body 52 so as to fix the retaining ring 54 to the body 52.

Alternatively, the retaining ring 54 can also be mounted on the body 52 in other manners, such as soldering.

Figure 4:
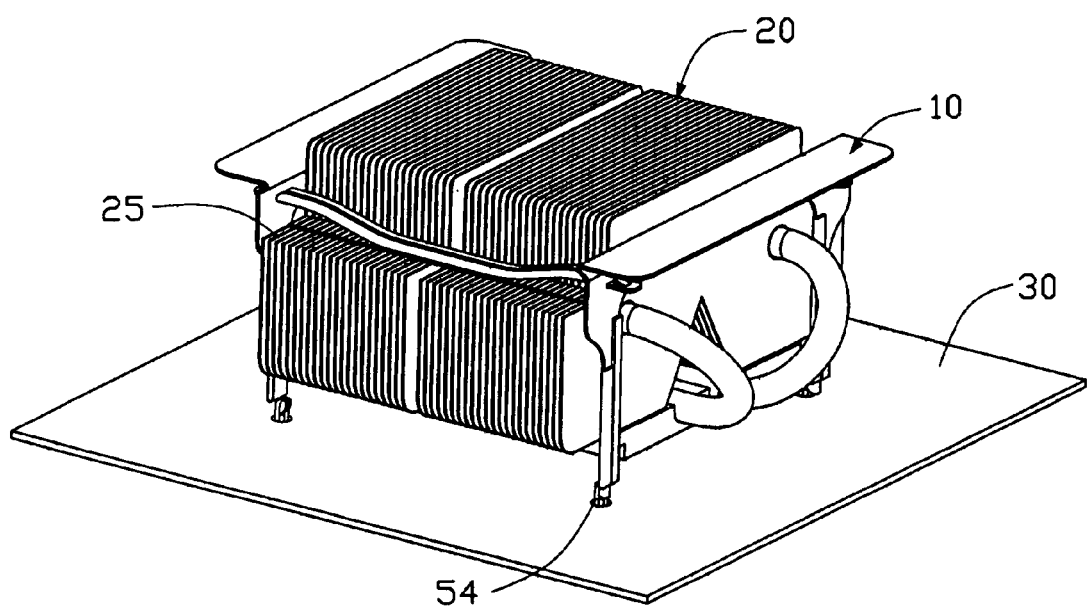
FIG. 4 is an assembled isometric view of FIG. 1.
Figure 5:
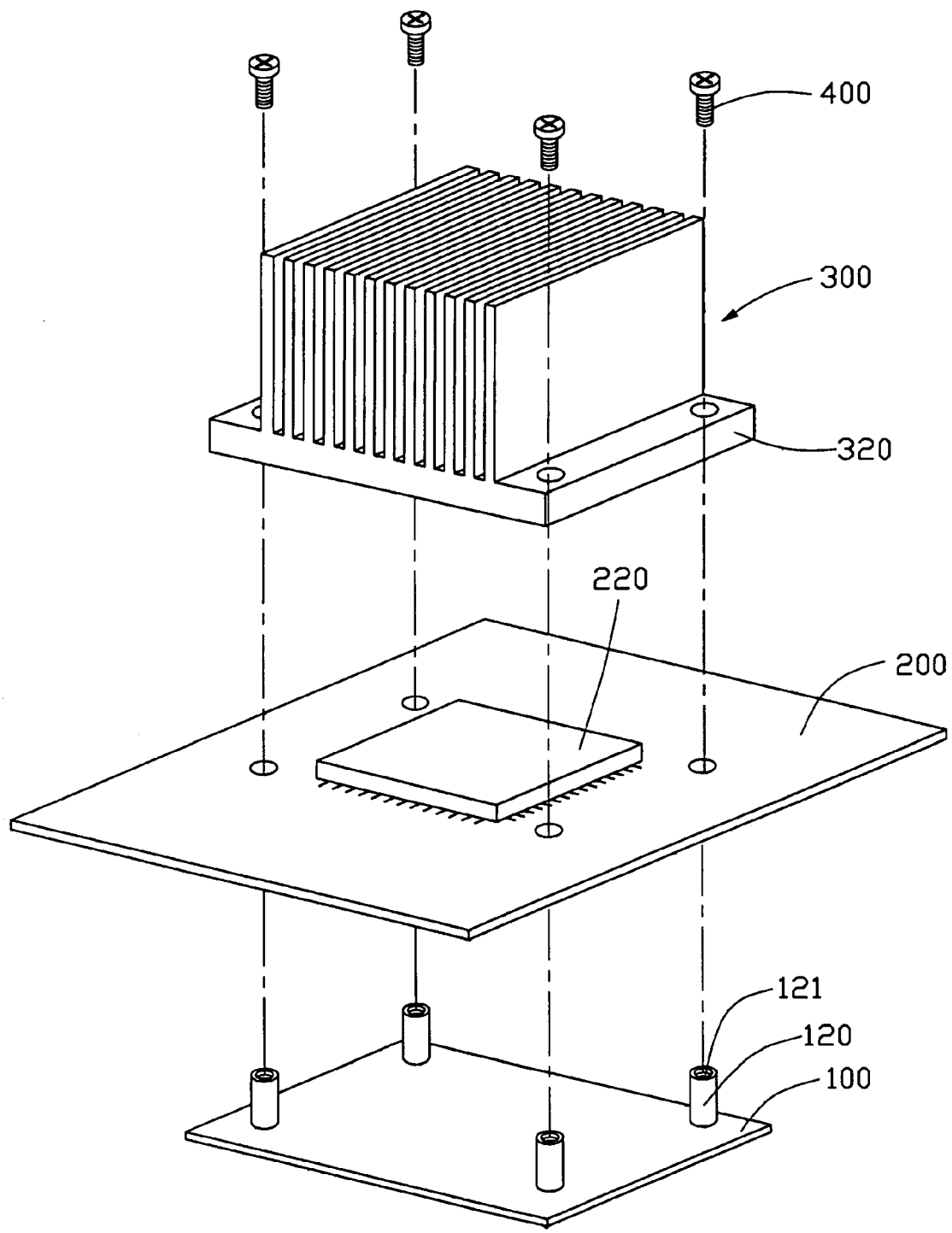
FIG. 5 is an exploded view of a heat sink retention device including a conventional back plate.

Please refer to FIG. 4 together. When mounting the heat sink 20, the back plate 50 is beforehand placed below the printed circuit board 30 with the retaining rings 54 extending upward through mounting holes defined in the printed circuit board 30 and beyond the top surface of the printed circuit board 30. The heat sink 20 is positioned on the processor 40 with the pressing members 12 of the clip 10 laid on the platforms 25 of the heat sink 20. The arms of the clip 10 are downwardly pressed to cause the retaining rings 54 to catch the hooks 145 of the clip 10. The pressing members 12 are elastically deformed to press the heat sink 20 toward the processor 40. The heat sink 20 is thus firmly mounted on the processor 40. A uniform size of the retaining rings 54 is easily achieved so as to ensure an uniform contact force generated between the processor 40 and the heat sink 20, and simultaneously avoiding damage to the printed circuit board 30.

It is understood that the invention may be embodied in other forms without departing from the spirit thereof. The above-described embodiments are to be considered in all respects as illustrative and not restrictive, and the invention is not to be limited to the details given above.

What is claimed is:

1. A retention device for mounting a heat sink to an electronic component mounted on a printed circuit board, comprising:
   a clip comprising pressing members for pressing the heat sink and at least a pair of hooks located at opposite sides of the pressing members; and
   a back plate adapted for being placed below the printed circuit board, the back plate comprising a body for biasing against the printed circuit board, and at least a pair of wire retaining rings mounted on the body for traveling through the printed circuit board to catch the hooks.

2. The retention device as claimed in claim 1, wherein the body comprises a flat rectangular central portion and two pairs of ears extending radially from four corners of the body, the retaining rings being mounted on the respective ears.

3. The retention device as claimed in claim 2, wherein the retaining ring is formed by bending a metal wire.

4. The retention device as claimed in claim 3, wherein the retaining ring comprises an inverted U-shaped retainer traveling through a slot defined in the ear, and a pair of claws inserted tightly into a pair of retaining holes defined in the ears on opposite sides of the slot.

5. The retention device as claimed in claim 2, wherein an opening is defined in the middle of the central portion.

6. The retention device as claimed in claim 1, wherein the clip comprises a pair of elongated pressing members and a pair of inverted U-shaped arms coupled to opposite ends of the pressing members.

7. The retention device as claimed in claim 6, wherein the hooks are formed at free ends of the arms.

8. An assembly comprising:
   a printed circuit board on which an electronic component is mounted;
   a back plate mounted below and biasing against the printed circuit board;
   a heat sink placed on the electronic component;
   a clip comprising a pair of pressing members resting on opposite sides of the heat sink and a plurality of hooks extending from ends of the pressing members; and
   a plurality of retaining rings extending from the back plate and passing through the printed circuit board to engage with the hooks to thereby secure the heat sink on the electronic component.

9. The assembly as claimed in claim 8, wherein the retaining ring is formed by bending a metal wire and mounted to the back plate.

10. The assembly as claimed in claim 9, wherein the clip comprises a pair of arms attached to opposite ends of the pressing members, the hooks being formed at bottom ends of the arms.

11. A retention device for mounting a heat sink to an electronic component mounted on a printed circuit board, comprising:
- a back plate placed beside said printed circuit board opposite to said electronic component, and comprising a plurality of retaining members extending therefrom through said printed circuit board around said electronic component; and
- a clip placed on said heat sink, comprising at least two pressing members placed against said heat sink at two opposite sides thereof, and an arm connecting ends of said at least two pressing members at a same side of said heat sink, said arm engagable with at least one of said retaining members so as to firmly mounting said heat sink to said electronic component by means of pressing deformation of said at least two pressing members on said heat sink.

12. The retention device as claimed in claim 11, wherein each of said retaining members is formed as a U-shaped metal wire.

13. The retention device as claimed in claim 11, wherein said arm is U-shaped and connects with said ends of said at least two pressing members at two corners of said U shape of said arm.

14. The retention device as claimed in claim 11, wherein a hook is formed at a free end of said arm away from said at least two pressing members to engage with said at least one of said retaining members.

\* \* \* \* \*